US012656697B2

(12) United States Patent
Chang et al.

(10) Patent No.: US 12,656,697 B2
(45) Date of Patent: *Jun. 16, 2026

(54) MODULE VESSEL WITH SCRUBBER GUTTERS SIZED TO PREVENT OVERFLOW

(71) Applicant: Taiwan Semiconductor Manufacturing Company, Ltd., Hsinchu (TW)

(72) Inventors: Chun-Kai Chang, Tainan City (TW); Yu Sheng Chiang, Chiayi City (TW); Yu De Liou, Taichung City (TW); Chi Yang, Tainan City (TW); Ching-Juinn Huang, Changhua (TW); Po-Chung Cheng, Chiayi County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 377 days.

This patent is subject to a terminal disclaimer.

(21) Appl. No.: 18/447,361

(22) Filed: Aug. 10, 2023

(65) Prior Publication Data

US 2023/0384697 A1 Nov. 30, 2023

Related U.S. Application Data

(63) Continuation of application No. 17/446,221, filed on Aug. 27, 2021, now Pat. No. 11,815,821.

(60) Provisional application No. 63/163,636, filed on Mar. 19, 2021.

(51) Int. Cl.
H05G 2/00 (2006.01)
G03F 7/00 (2006.01)

(52) U.S. Cl.
CPC ...... *G03F 7/70925* (2013.01); *G03F 7/70033* (2013.01); *G03F 7/70808* (2013.01); *G03F 7/70975* (2013.01); *H05G 2/0094* (2024.08)

(58) Field of Classification Search
CPC ............ G03F 7/70925; G03F 7/70033; G03F 7/70808; G03F 7/70975; H05G 2/0094
See application file for complete search history.

(56) References Cited

U.S. PATENT DOCUMENTS

| | | | | |
|---|---|---|---|---|
| 7,372,049 | B2 | 5/2008 | Van Herpen et al. | |
| 8,149,378 | B2 | 4/2012 | Morishima et al. | |
| 11,470,710 | B2 | 10/2022 | Cheng et al. | |
| 11,815,821 | B2 * | 11/2023 | Chang .................. | H05G 2/0094 |
| 2010/0258749 | A1 | 10/2010 | Partlo et al. | |
| 2015/0338753 | A1 | 11/2015 | Riepen et al. | |
| 2018/0376575 | A1 | 12/2018 | Chien et al. | |
| 2019/0289704 | A1 | 9/2019 | Baek et al. | |

(Continued)

FOREIGN PATENT DOCUMENTS

| | | |
|---|---|---|
| CN | 101356476 A | 1/2009 |
| CN | 108472497 A | 8/2018 |

(Continued)

*Primary Examiner* — Nicole M Ippolito
(74) *Attorney, Agent, or Firm* — Harrity & Harrity, LLP

(57) ABSTRACT

An extreme ultraviolet (EUV) source includes a module vessel and a scrubber system. The scrubber system may include a plurality of gutters in the module vessel. The plurality of gutters may include a first gutter and a second gutter. The second gutter may be lower than the first gutter in the module vessel. A unit volume of the second gutter is larger than a unit volume of the first gutter.

20 Claims, 9 Drawing Sheets

(56)  References Cited

U.S. PATENT DOCUMENTS

| | | | |
|---|---|---|---|
| 2020/0037427 | A1 | 1/2020 | Yang et al. |
| 2020/0278617 | A1 | 9/2020 | Wu et al. |
| 2020/0314989 | A1 | 10/2020 | Yang et al. |
| 2022/0299891 | A1 | 9/2022 | Chang et al. |

FOREIGN PATENT DOCUMENTS

| | | | |
|---|---|---|---|
| CN | 109148320 | A | 1/2019 |
| CN | 110967936 | A | 4/2020 |
| KR | 20080096429 | A | 10/2008 |
| WO | 2009032054 | A1 | 3/2009 |

* cited by examiner

MODULE VESSEL WITH SCRUBBER GUTTERS SIZED TO PREVENT OVERFLOW

CROSS-REFERENCE TO RELATED APPLICATIONS

This patent application is a continuation of U.S. patent application Ser. No. 17/446,221, filed on Aug. 27, 2021, and entitled "MODULE VESSEL WITH SCRUBBER GUT-TERS SIZED TO PREVENT OVERFLOW," which claims priority to U.S. Provisional Patent Application No. 63/163, 636, filed on Mar. 19, 2021, and entitled "MODULE VES-SEL WITH SCRUBBER GUTTERS SIZED TO PREVENT OVERFLOW." The disclosures of the prior applications are considered part of and are incorporated by reference into this patent application.

BACKGROUND

A radiation source, such as an extreme ultraviolet (EUV) source, can generate light (e.g., EUV light) using a laser to excite particles, such as tin (Sn) particles. In operation, the laser excites the particles to generate a plasma (e.g., a tin-based plasma) that emits light in the desired radiation wavelength range. A module vessel of the radiation source can include a scrubber system comprising a set of vanes and a pump. In operation, the scrubber system pumps remaining vapor from the module vessel (e.g., through the vanes, using the pump).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
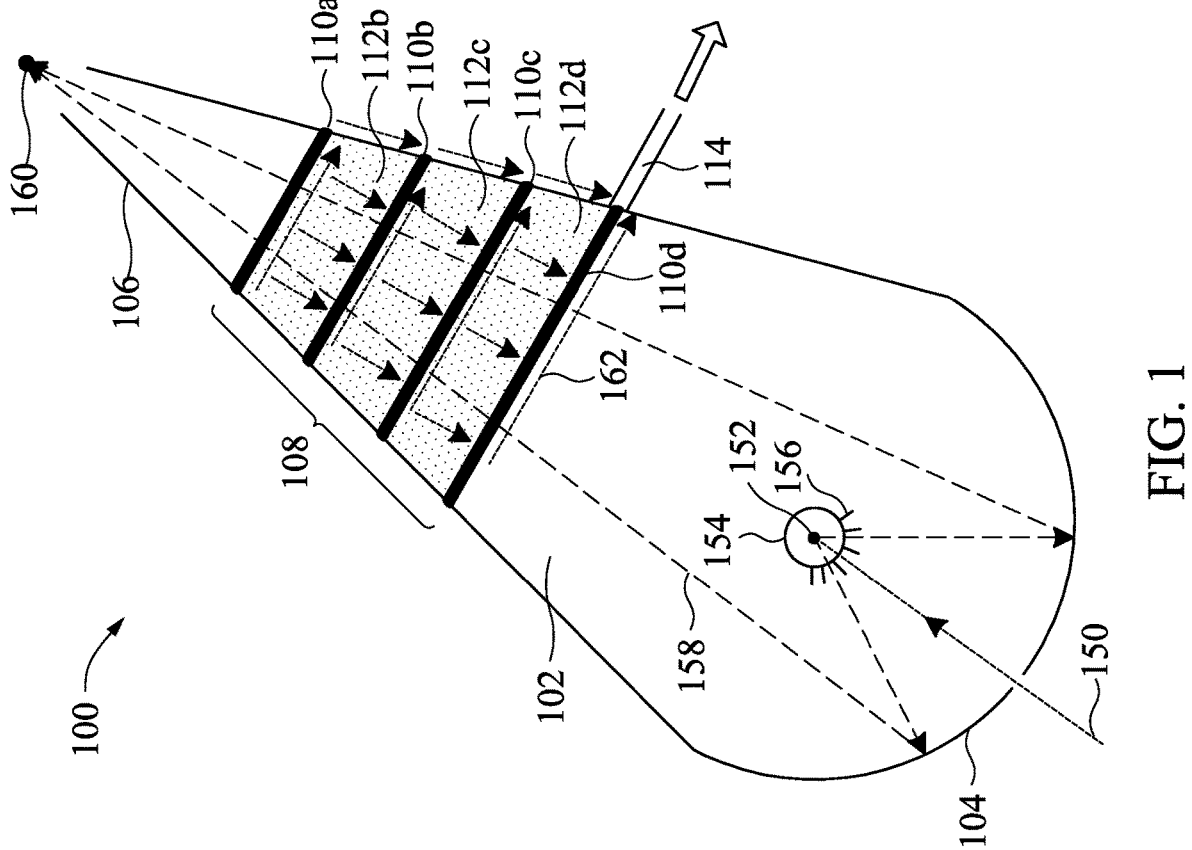
FIG. 1 is a diagram illustrating an example radiation source including a scrubber system as described herein.

The following disclosure provides many different embodiments, or examples, for implementing different fea-tures of the provided subject matter. Specific examples of components and arrangements are described below to sim-plify the present disclosure. These are, of course, merely examples and are not intended to be limiting. For example, the formation of a first feature over or on a second feature in the description that follows may include embodiments in which the first and second features are formed in direct contact, and may also include embodiments in which addi-tional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accord-ingly.

As described above, a module vessel of a radiation source, such as an EUV source, may include a scrubber system designed to pump out vapor from the module vessel. For example, a pump may draw the vapor through the scrubber system and pump the vapor through an exhaust port of the module vessel. In operation, some particles condense on the vanes of the scrubber system to form a liquid on the vanes. The liquid that is condensed on the vanes is drained along the vanes and accumulates in gutters of the scrubber system. The liquid is then drained from the gutters and out through a drain path of the scrubber system of the radiation source.

In some cases, the scrubber system has multiple vanes (e.g., three layers of vanes) and multiple gutters (e.g., four gutters) to be utilized for draining the condensed liquid material from the module vessel. Notably, although the gutters have different lengths (e.g., since each gutter is at a different height of the module vessel), the gutters have the same cross-sectional area and, therefore, a same unit volume (i.e., total volume/perimeter). Here, when the liquid accu-mulates to a lower gutter of the scrubber system (e.g., a gutter nearer to a collector of the radiation source), the volume of the lower gutter may be insufficient to contain all of the liquid since liquid from one or more higher gutters can drain through the lower gutter. As a result, the lower gutters can overflow, which causes the liquid material to drip on the collector of the radiation source. The dripping of the liquid material on the collector can result in contamination of or damage to the collector, which shortens a lifetime of the collector or degrades performance of the radiation source.

Some aspects described herein provide techniques and apparatuses of a scrubber system including multiple gutters, where a lower gutter has a larger unit volume (e.g., a larger cross-sectional area) than a higher gutter. For example, a lower gutter of the scrubber system may have a larger unit volume than a next highest gutter of the scrubber system. In some implementations, a lowest gutter has the largest unit volume of any gutter in the scrubber system. In some implementations, a highest gutter has the smallest unit volume of any gutter in the scrubber system. In some implementations, a unit volume of the gutters increases from higher gutters to lower gutters of the scrubber system. In some implementations, the larger unit volume for the lower gutters prevents overflow induced by a lack of volume of the gutters of the scrubber system. Prevention of overflow prevents contamination of or damage to the collector of the radiation source, thereby improving a lifetime of the col-lector and improving performance of the radiation source.

In this way, the progressively increasing unit volume of the gutters in the scrubber system increase the liquid removal performance of the scrubber system. The perfor-mance can be increased without having to increase the size of the module vessel, and without having to increase the angle between the IF cap and the collector, and without impacting the light cone of EUV radiation generated by the EUV source, which reduces the complexity of retrofitting the scrubber system described herein into the module vessel.

FIG. 1 is a diagram illustrating an embodiment of a radiation source 100. The radiation source 100 may be, for example, an EUV source. As shown in FIG. 1, the radiation source 100 includes a module vessel 102, a collector 104, an intermediate focus (IF) cap 106, and a scrubber system 108. Notably, radiation source 100 includes other components and features that, for the purposes of clarity, are not shown in FIG. 1. The other components and features of the radiation source 100 may include, for example, a laser source, a beam delivery system, a focus lens, a droplet generator, a droplet collector, one or more exhaust ports, a pump, or a dynamic gas lock (DGL), among other examples.

The radiation source 100 utilizes a laser produced plasma (LPP) to generate light (e.g., EUV light). In operation, a laser source, such as a pulse carbon dioxide ($CO_2$) laser generates a laser beam 150. As shown, the laser beam 150 is provided (e.g., by a beam delivery system to a focus lens) such that the laser beam 150 is focused through a window of the collector 104. The laser beam 150 is focused to target material 152 (e.g., Sn droplets provided by a droplet generator), which generates plasma 154. The plasma 154 produces plasma emission 156, some of which is radiation 158. As shown, the collector 104 reflects and focuses the radiation 158 through the module vessel 102 toward an intermediate focus 160 through an opening of the IF cap 106 (e.g., for use in a lithography exposing process).

The IF cap 106 is a component that provides intermediate focus to the radiation 158. In some implementations, a DGL is integrated in the IF cap 106. The DGL of the IF cap 106 serves to prevent a substance in the module vessel 102 from leaving the module vessel 102. For example, the DGL can inject, via a group of DGL nozzles, a fluid (e.g., hydrogen gas ($H_2$)) in a direction away from an opening of the IF cap 106 in order to prevent a fluid, particles, droplets, or another type of material present in the environment of the module vessel 102 from leaving the module vessel 102 (e.g., to prevent the particles or droplets from moving to a scanner).

The scrubber system 108 is a component that removes vapor (e.g., Sn vapor) from the module vessel 102 and drains liquid (e.g., condensed Sn particles) from the module vessel 102. In some implementations, as shown in FIG. 1, the scrubber system 108 includes a plurality of gutters 110 (e.g., gutters 110a through 110d), a plurality of vane layers 112 (e.g., vane layers 112b through 112d), and a drain path 114. In some implementations, the scrubber system 108 includes one or more other components not shown in FIG. 1, such as a pump and one or more exhaust ports. In operation, the scrubber system 108 (e.g., using the pump) draws vapor through the vane layers 112 pumps the vapor through the one or more exhaust ports of the module vessel 102. Further, some particles condense on the vane layers 112 of the scrubber system 108 to form a liquid 162 on the vane layers 112. The liquid 162 is drained along the vane layers 112 and accumulates in the gutters 110 of the scrubber system 108. The liquid 162 is then drained from the gutters 110 and out through the drain path 114 of the scrubber system 108 (e.g., such that the liquid 162 is drained from the module vessel 102 of the radiation source 100). Additional details regarding the scrubber system 108 are provided below.

As indicated above, FIG. 1 is provided as an example. Other examples may differ from what is described with regard to FIG. 1. The number and arrangement of components shown in FIG. 1 are provided as an example. In practice, there may be additional components, fewer components, different components, or differently arranged components than those shown in FIG. 1.

FIGS. 2A-2E are diagrams illustrating an embodiment of the gutters 110 and the vane layers 112 of the scrubber system 108 in the radiation source 100. In some implementations, as noted above, the scrubber system 108 includes a plurality of gutters 110 and a plurality of vane layers 112. For example, as shown in FIGS. 2A-2E, in some implementations, the scrubber system 108 includes four gutters 110 (e.g., gutters 110a through 110d) and three vane layers 112 (e.g., vane layers 112b through 112d).

In the example shown in FIGS. 2A-2E, a sidewall length ratio of the IF cap 106 and the scrubber system 108 is approximately 2:1. However, other values for the sidewall length ratios of the IF cap 106 and the scrubber system 108 are within the scope of the present disclosure. A sidewall length of each vane layer 112 is defined as L, and so a total sidewall length of the three vane layers 112 (e.g., the vane layers 112b through 112d) is 3L and a sidewall length of the IF cap 106 is xL, where x may be a value of, for example, 6. However, other values for the sidewall length ratios of the IF cap 106 and the vane layers 112 are within the scope of the present disclosure. Further, particles are assumed to be deposited evenly on surfaces of the scrubber system 108, and therefore an amount of liquid 162 drained from a unit area of a given portion of the scrubber system 108 is the same. Additionally, since only vane layers 112 will drain liquid 162, any drainage of liquid 162 from the sidewall of the IF cap 106 can be excluded from consideration.

In the example implementation shown in FIGS. 2A-2E, an area A0 (e.g., corresponding approximately to a surface area of an interior sidewall of the IF cap 106) is approximately equal to $6\pi rL$ (e.g., $[(6L)^2]\pi \times (2\pi r/(2\ \pi 6L)) = 6\pi rL$), where r is a radius of the gutter 110a and L is a length of a sidewall of each vane layer 112. However, other values for the area A0 are within the scope of the present disclosure. Notably, liquid 162 does not drain into the vane layers 112 from the area A0. In this example, the perimeter length P0 of the gutter 110a is approximately equal to $2\pi r$. However, other values for the perimeter length P0 are within the scope of the present disclosure. Here, no vane layer 112 is present in area A0, meaning that drainage of liquid 162 from the sidewall of the IF cap 106 can be excluded for the purposes of designing the scrubber system 108.

Continuing this example, liquid 162 from an area A1 (e.g., corresponding to an area of the vane layer 112b) drains toward the gutter 110b. Here, the area A1 is approximately equal to $$\frac{13}{6}\ \pi rL \left( \text{e.g., } [(7\ L)^2]\pi \times [(2\ \pi r1/(2\pi 7\ L))] - \right.$$

$$\left. A0 = [(7\ L)^2]\pi \times [(2\pi(7/6)r/(2\pi 7\ L))] - 6\ \pi rL = \frac{13}{6}\ \pi rL \right).$$

However, other values for the area A1 are within the scope of the present disclosure. Further, the perimeter length P1 of the gutter 110b is approximately equal to $$\frac{7}{3}\ \pi r \left( \text{e.g., } 2\ \pi r1 = 2\pi(7/6)r = \frac{7}{3}\ \pi r \right).$$

Figure 2A:
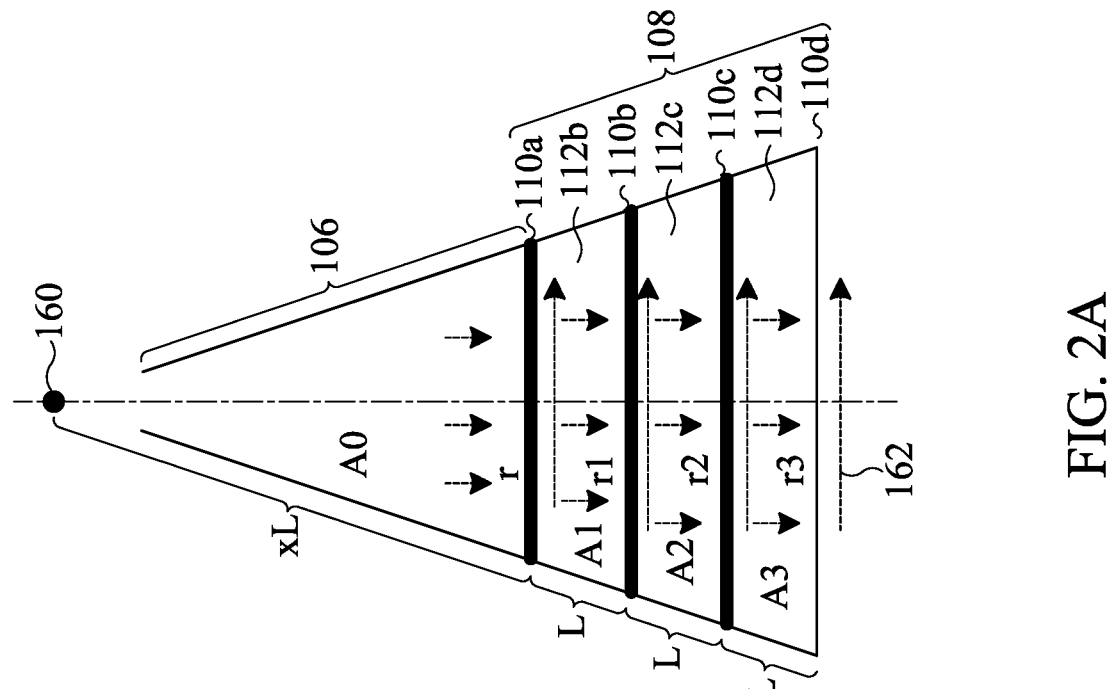
FIGS. 2A-2E are diagrams an embodiment of gutters and vane layers of the scrubber system described herein.
Figures 2B, 2C, 2D:
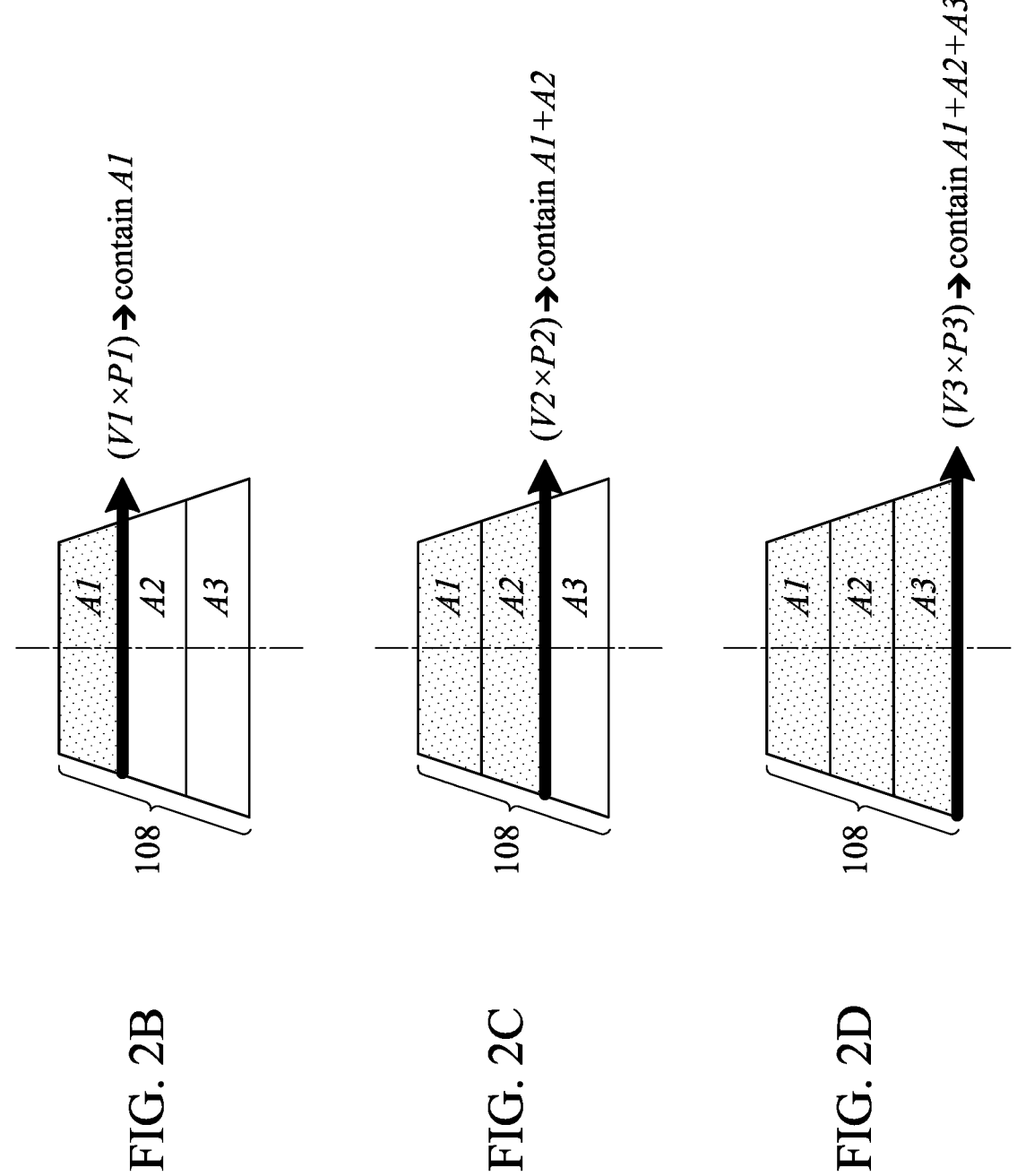

However, other values for the perimeter length P1 are within the scope of the present disclosure. Here, as illustrated in FIG. 2B, the gutter 110b should be sized to contain liquid 162 from the area A1 in order to prevent overflow of the gutter 110b. For example, in some implementations, a unit volume V1 of the gutter 110b is approximately equal to $$\frac{13}{14}\,L \left(\text{e.g., } A1/P1 = \left(\frac{13}{6}\,\pi rL\right)\Big/\left(\frac{7}{3}\,\pi r\right) = \frac{13}{14}\,L\right).$$

However, other values for the unit volume V1 are within the scope of the present disclosure. Notably, liquid 162 from the area A1 can also drain through or past gutter 110b (e.g., through a vertical drain path) toward lower gutters 110 of the scrubber system 108. Additionally, liquid 162 from an area A2 (e.g., corresponding to an area of the vane layer 112c) drains toward the gutter 110c. Here, the area A2 is approximately equal to $$\frac{15}{6}\,\pi rL \left(\text{e.g., } \left[(8\,L)^2\right]\pi \times \left[(2\,\pi r2/(2\pi 8\,L))\right] - A0 - \right.$$

$$\left. A1 = \left[(8\,L)^2\right]\pi \times \left[(2\pi(8/6)r/(2\pi 8\,L))\right] - 6\,\pi rL - \frac{13}{6}\,\pi rL = \frac{15}{6}\,\pi rL\right).$$

However, other values for the area A2 are within the scope of the present disclosure. Further, the perimeter length P2 of the gutter 110c is approximately equal to $$\frac{8}{3}\,\pi r \left(\text{e.g., } 2\,\pi r2 = 2\pi(8/6)r = \frac{8}{3}\,\pi r\right).$$

However, other values for the perimeter length P2 are within the scope of the present disclosure. Additionally, as noted above, liquid 162 from the area A1 can drain to the gutter 110c (e.g., through or past the gutter 110b). Here, as illustrated in FIG. 2C, the gutter 110c should be sized to contain liquid 162 from the area A1 and the area A2 in order to prevent overflow of the gutter 110c. For example, in some implementations, a unit volume V2 of the gutter 110c is approximately equal to $$\frac{7}{4}\,L \left(\text{e.g., } (A1 + A2)/P2 = \left[\left(\frac{13}{6}\,\pi rL\right) + \left(\frac{15}{6}\,\pi rL\right)\right]\Big/\left(\frac{8}{3}\,\pi r\right) = \frac{7}{4}\,L\right).$$

However, other values for the unit volume V2 are within the scope of the present disclosure. Notably, liquid 162 from the area A1 or the area A2 can also drain through or past gutter 110c (e.g., through a vertical drain path) toward lower gutters 110 of the scrubber system 108. Similarly, liquid 162 from an area A3 (e.g., corresponding to an area of the vane layer 112d) drains toward the gutter 110d. Here, the area A3 is approximately equal to $$\frac{17}{6}\,\pi rL \left(\text{e.g., } \left[(9\,L)^2\right]\pi \times \left[(2\,\pi r3/(2\pi 9\,L))\right] - A0 - A1 - A2 = \left[(9\,L)^2\right]\right.$$

$$\left. \pi \times \left[(2\pi(9/6)r/(2\pi 9\,L))\right] - 6\,\pi rL - \frac{13}{6}\,\pi rL - \frac{15}{6}\,\pi rL = \frac{17}{6}\,\pi rL\right).$$

However, other values for the area A3 are within the scope of the present disclosure. Further, the perimeter length P3 of the gutter 110d is approximately equal to 3πr (e.g., 2πr3=2π (9/6)r=3πr). However, other values for the perimeter length P3 are within the scope of the present disclosure. Additionally, as noted above, liquid 162 from the area A1 or the area A2 can drain to the gutter 110d (e.g., through or past the gutter 110c). Here, as illustrated in FIG. 2D, the gutter 110d should be sized to contain liquid 162 from the area A1, the area A2, and the area A3 in order to prevent overflow of the gutter 110d. For example, in some implementations, a unit volume V3 of the gutter 110d is approximately equal to $$\frac{5}{2}\,L \left(\text{e.g., } (A1 + A2 + A3)/P3 = \right.$$

$$\left. \left[\left(\frac{13}{6}\,\pi rL\right) + \left(\frac{15}{6}\,\pi rL\right) + \left(\frac{17}{6}\,\pi rL\right)\right]\Big/(3\,\pi r) = \frac{5}{2}\,L\right).$$

However, other values for the unit volume V3 are within the scope of the present disclosure.

In some implementations, to enable the gutters 110 to prevent overflow as described above, a unit volume of a lower gutter 110 may be larger than a unit volume of a higher gutter 110. For example, a unit volume V3 of the gutter 110d may be larger than a unit volume V2 of the gutter 110c. As a particular example, the unit volume V3 of the gutter 110d may be $$\frac{5}{2}\,L$$

and the unit volume V2 of the gutter 110c may be $$\frac{7}{4}\,L,$$

as described in the above example. However, other values for the unit volumes V2 and V3 are within the scope of the present disclosure. Similarly, the unit volume V2 of the gutter 110c may be larger than a unit volume V1 of the gutter 110b. As a particular example, the unit volume V2 of the gutter 110c may be $$\frac{7}{4}\,L$$

and the unit volume V1 of the gutter 110b may be $$\frac{13}{14}\,L,$$

as described in the above example. However, other values for the unit volumes V1 and V2 are within the scope of the present disclosure. Notably, in the example shown in FIGS. 2A-2E, since no vane layer 112 is present at the area A0, the gutter 110a may have a unit volume V0 that matches (e.g., is approximately equal to) a unit volume V1 of the gutter 110b. That is, the unit volume V0 of the gutter 110a need not be increased relative to that of the unit volume V1 of the gutter 110b.

Figure 2E:
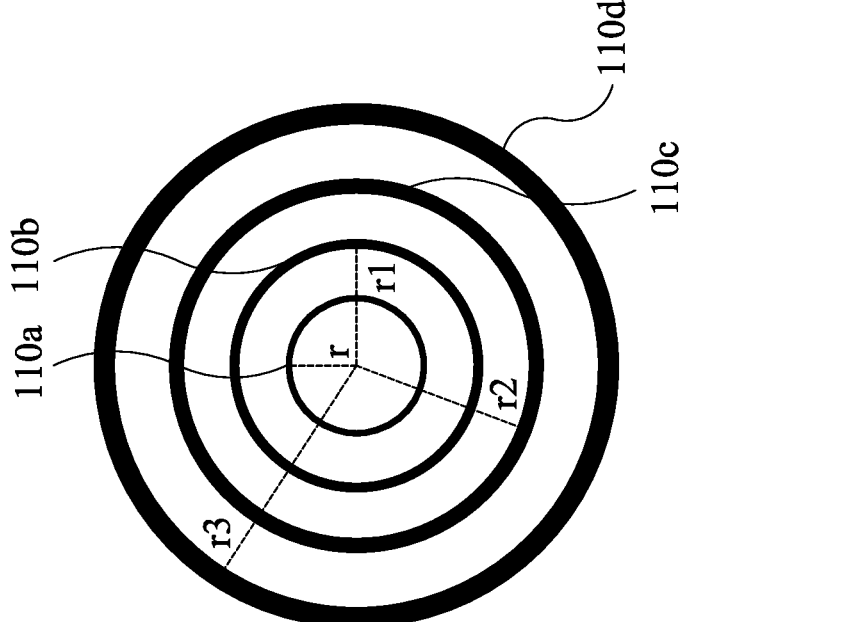

FIG. 2E is a diagram illustrating relative unit volumes among the gutters 110 of the scrubber system 108. In FIG. 2E, a width of a line representing a given gutter 110 indicates a relative width of the given gutter 110 to another gutter 110. As shown in FIG. 2E, the gutter 110*d* has a largest unit volume, followed by the gutter 110*c*, followed by the gutter 110*b* and the gutter 110*a* (e.g., where the gutter 110*a* and the gutter 110*b* have the same unit volume).

In some implementations, a gutter 110 with a comparatively larger unit volume than that of another gutter 110 may have a unit volume that is approximately two times larger than that of the other gutter 110. For example, the gutter 110*d* may have a unit volume V3 that is approximately two times larger than the unit volume V2 of the gutter 110*c*. Similarly, the gutter 110*c* may have a unit volume V2 that is approximately two times larger than the unit volume V1 of the gutter 110*b*. In some implementations, a given gutter 110 having a unit volume that is approximately two times larger than a next highest gutter 110 ensures that the given gutter 110 will not overflow as a result of collecting liquid 162 draining from a vane layer 112 associated with the next highest gutter 110 (and one or more other vane layers 112 above that vane layer 112), thereby preventing overflow of the particular gutter 110.

In some implementations, a gutter 110 with a comparatively larger unit volume than that of another gutter 110 may have a cross-sectional area that is larger than that of the other gutter 110. That is, in some implementations, the larger unit volume may be provided by forming the gutter 110 to be comparatively wider or deeper than the other gutter 110. Notably, an increase to the cross-sectional area of the gutter 110 may be utilized to increase the unit volume, rather than a decrease to a perimeter length of the gutter 110, since decreasing the perimeter length of the gutter 110 may not be possible due to design constraints of the module vessel 102 (e.g., since the perimeter length is fixed in order to conform with dimensions of the module vessel 102).

In some implementations, a unit volume of a lowest gutter 110 is larger than a unit volume of each other gutter 110. For example, as illustrated in the example associated with FIGS. 2A-2E, the unit volume V3 of the gutter 110*d* may be larger than the unit volume V2 of the gutter 110*c*, the unit volume V1 of the gutter 110*b*, and the unit volume V0 of the gutter 110*a*. In some implementations, the lowest gutter 110 having the largest unit volume enables the lowest gutter 110 to prevent overflow of the lowest gutter 110 by allowing the lowest gutter 110 to collect liquid 162 from one or more higher gutters 110, which prevents contamination of or damage to the collector 104 of the radiation source 100.

In some implementations, a unit volume of a highest gutter 110 is approximately equal to or is smaller than a unit volume of each other gutter 110. For example, as illustrated in the example associated with FIGS. 2A-2E, the unit volume V0 of the gutter 110*a* may be approximately equal to the unit volume V1 of the gutter 110*b*. That is, the unit volume of the highest gutter (e.g., the gutter 110*a*) may in some implementations match a unit volume of a second-highest gutter 110 (e.g., the gutter 110*b*). Continuing this example, the unit volume V0 of the gutter 110*a* may be smaller than the unit volume V2 of the gutter 110*c* and smaller than the unit volume V3 of the 110*d*. In some implementations, the highest gutter 110 having a unit volume that is approximately equal to the second-highest gutter 110 reduces a modification to the design of the radiation source 100 needed to integrate the scrubber system 108 described herein (e.g., since the same design can be used for the gutters 110*a* and 110*b*), meaning that cost or manufacturability of the radiation source 100 is improved (e.g., as compared to an implementation that requires a complete redesign of the gutters 110).

In some implementations, a ratio of unit volumes V1, V2, and V3 (e.g., among the gutter 110*b*, the gutter 110*c*, and the gutter 110*d*, respectively) is in the ranges of approximately $$1{:}\ 1.75{-}2{:}\ 2.5{-}3\ \left(\text{e.g.,}\ \frac{13}{14}\ L{:}\ \frac{7}{4}\ L{:}\ \frac{5}{2}\ L\right).$$

In other words, the ratio between the unit volume V1 and V2 is in a range of approximately 1:1.75 to approximately 1:2, and the ratio between the unit volume V1 and V3 is in a range of approximately 1:2.5 to approximately 1:3. This reduces a risk of overflow of gutters 110 of the scrubber system 108 is mitigated by relative unit volumes of the gutters 110. In some implementations, a larger ratio can be utilized in order to improve prevention of overflow. For example, in some implementations, a ratio of unit volumes among three adjacent gutters 110 may be approximately equal to 1: approximately 2: approximately 4. An implementation that utilizes a larger ratio of gutter 110 unit volumes increases a tolerance to fluctuation in an amount of liquid 162 that accumulates in a given area (e.g., when liquid 162 does not accumulate uniformly on the vane layers 112), meaning that a likelihood of a given gutter 110 overflowing is further reduced.

In one particular example implementation, the radius r is in a range from approximately centimeters (cm) to approximately 30 cm, such as 25 cm, and the length L is approximately cm. Using the relationships described above, the area A0 is equal to approximately 7065 cm², the area A1 is equal to approximately 2551 cm², the area A2 is equal to approximately 2943 cm², and the area A3 is equal to approximately 3336 cm². Further, the unit volume V1 is equal to approximately 13.9 cm²/cm, the unit volume V2 is equal to approximately 26.25 cm²/cm, and the unit volume V3 is equal to approximately 37.5 cm²/cm. Notably, these unit volumes indicate an amount of unit area needed for a unit of length, and not an exact size. Continuing with this example, the perimeter length P1 of the gutter 110*b* may be equal to approximately 183 cm, the perimeter length P2 of the gutter 110*c* may be equal to approximately 209 cm, and the perimeter length P3 of the gutter 110*d* may be equal to approximately 235 cm.

As indicated above, FIGS. 2A-2E are provided as examples. Other examples may differ from what is described with regard to FIGS. 2A-2E. The number and arrangement of components shown in FIGS. 2A-2E are provided as an example. In practice, there may be additional components, fewer components, different components, or differently arranged components than those shown in FIGS. 2A-2E.

Figure 3A:
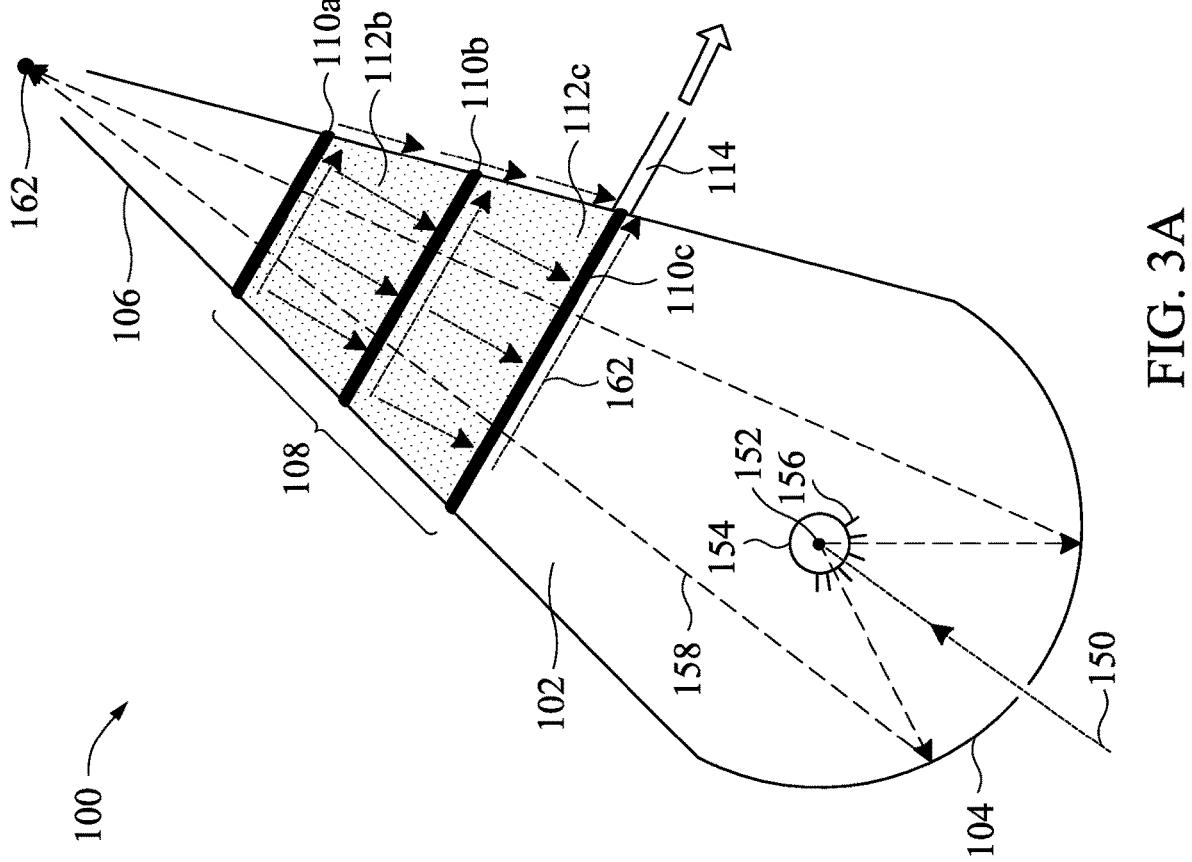
FIGS. 3A and 3B are diagrams illustrating alternative embodiments of gutters and vane layers of the scrubber system described herein.
Figure 3B:
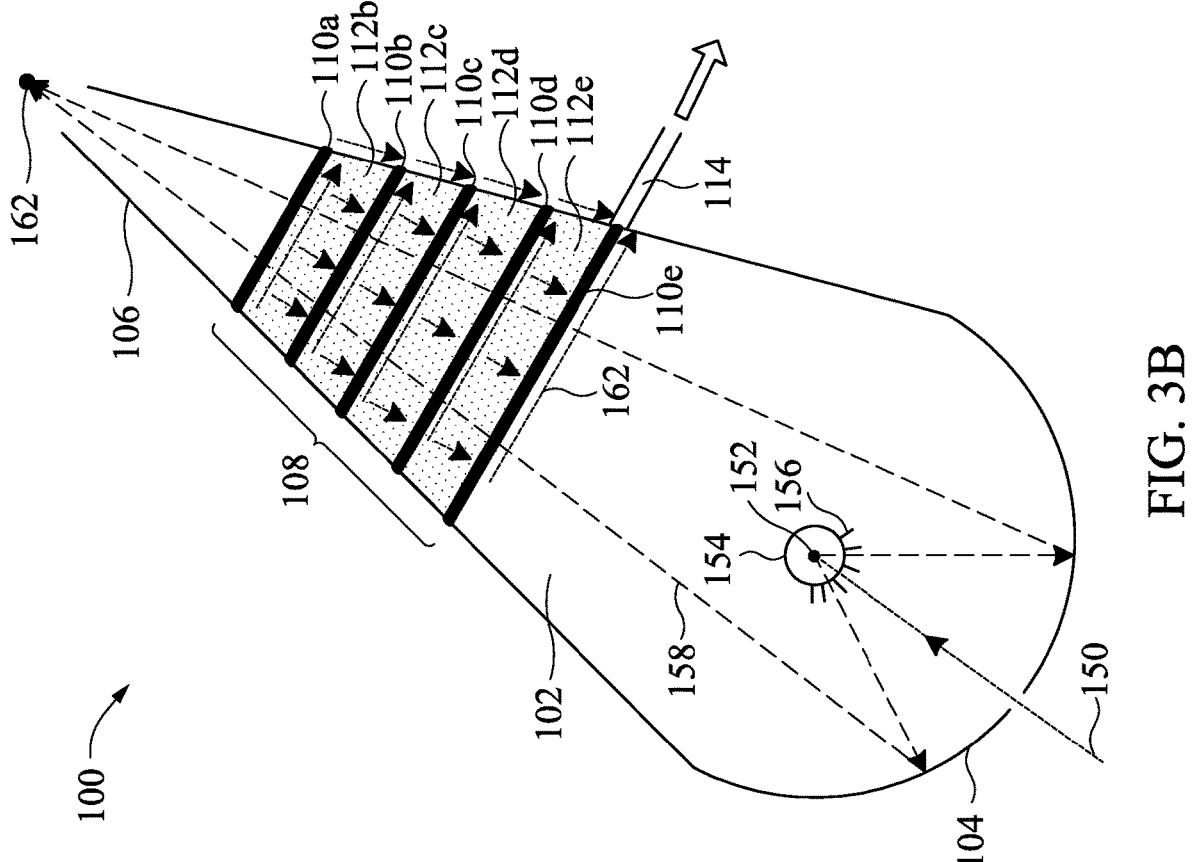

FIGS. 3A and 3B are diagrams illustrating alternative embodiments of the gutters 110 and the vane layers 112 of the scrubber system 108. In some implementations, the scrubber system 108 may include a different number of gutters 110 or vane layers 112 than shown in the example associated with FIGS. 2A-2E.

FIG. 3A is a diagram illustrating an example implementation of the scrubber system 108 that includes three gutters 110 (e.g., gutters 110*a* through 110*c*) and two vane layers 112 (e.g., vane layers 112*b* and 112*c*). Unit volumes of the gutters 110 in an implementation such as that shown in FIG. 3A can be determined in a manner similar to that described above in association with FIGS. 2A-2E, with appropriate alterations to the derivations of the unit volumes based on the geometry of the scrubber system 108 that includes only three gutters 110 (rather than four gutters 110). In some implementations, an implementation such as that shown in FIG. 3A reduces cost and complexity of the scrubber system 108 (e.g., as compared to an implementation with a comparatively larger quantity of gutters 110 vane layers 112).

FIG. 3B is a diagram illustrating an example implementation of the scrubber system 108 that includes five gutters 110 (e.g., gutters 110a through 110e) and four vane layers 112 (e.g., vane layers 112b through 112e). Unit volumes of the gutters 110 in an implementation such as that shown in FIG. 3B can be determined in a manner similar to that described above in association with FIGS. 2A-2E, with appropriate alterations to the derivations of the unit volumes based on the geometry of the scrubber system 108 that includes five gutters 110 (rather than four gutters 110). In some implementations, an implementation such as that shown in FIG. 3B further reduces a risk of overflow of a given gutter 110 (e.g., as compared to an implementation with a comparatively smaller quantity of gutters 110 vane layers 112).

As indicated above, FIGS. 3A and 3B are provided as examples. Other examples may differ from what is described with regard to FIGS. 3A and 3B. The number and arrangement of components shown in FIGS. 3A and 3B are provided as an example. In practice, there may be additional components, fewer components, different components, or differently arranged components than those shown in FIGS. 3A and 3B.

Figure 4:
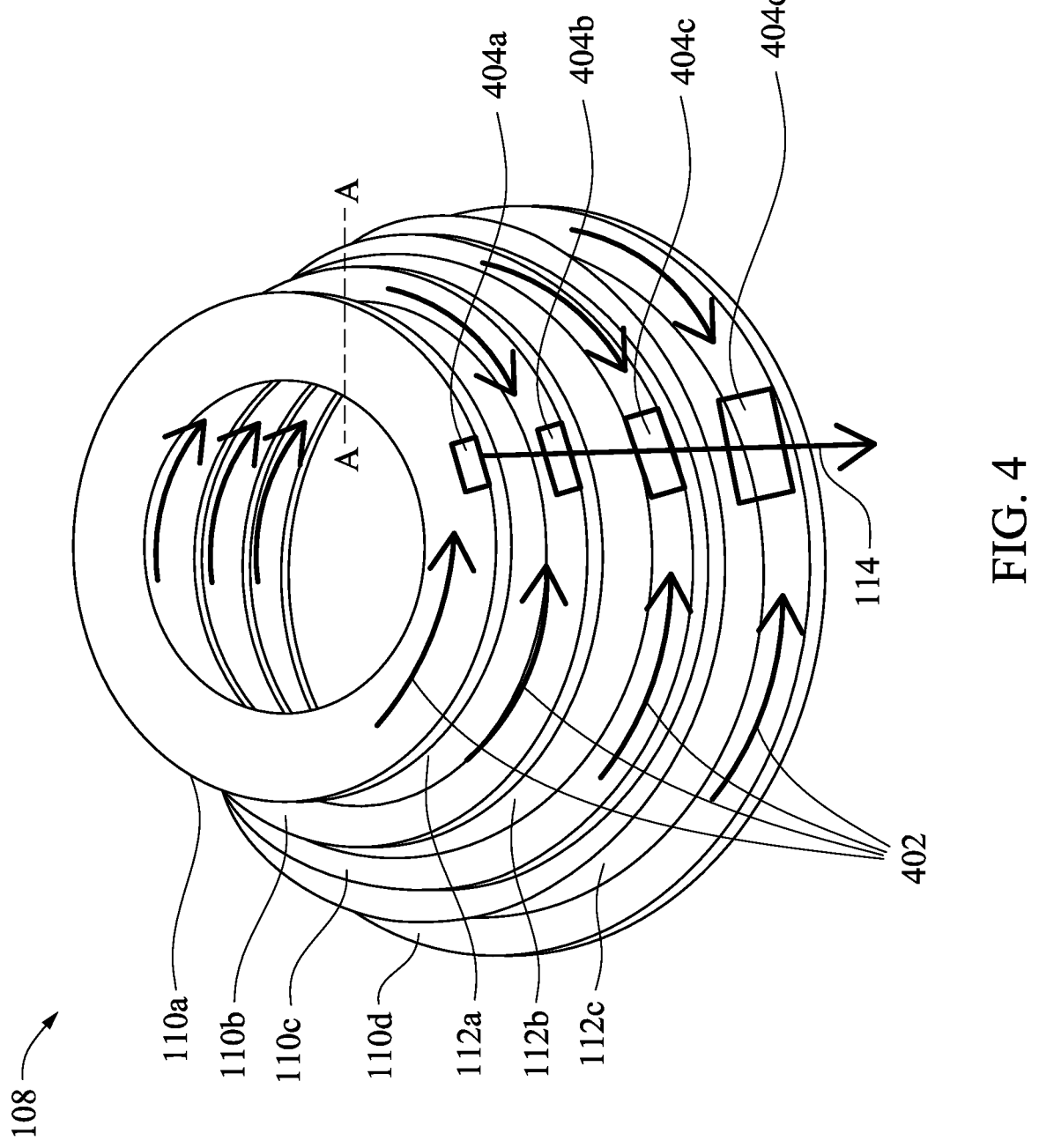
FIG. 4 is a diagram illustrating a perspective view of a scrubber system described herein.

FIG. 4 is a diagram of a perspective view of the scrubber system 108 described herein. As shown in FIG. 4, each of the gutters 110a-110d includes a ring-shaped structure with an opening in the center to permit the radiation 158 to pass through the gutters 110a-110d without being obstructed by the gutters 110a-110d.

As further shown in FIG. 4, the gutter 110a (e.g., the top gutter or roof gutter) is located above the gutter 110b (e.g., the layer 1 gutter), the gutter 110c (e.g., the layer 2 gutter) is located below the gutter 110b, and the gutter 110d (e.g., the layer 3 gutter) is located below the gutter 110c. Vane layers 112 are located between the gutters 110. In particular, the vane layer 112a is located between the gutter 110a and the gutter 110b, the vane layer 112b is located between the gutter 110b and the gutter 112c, and the vane layer 112c is located between the gutter 110c and the gutter 112d.

As further shown in FIG. 4, the gutters 110a-110d are connected by the drain path 114, which extends from the gutter 110a down to the gutter 110d through the gutters 110b and 110c. The drain path 114 provides a path for liquid (e.g., tin (Sn)) collected in the gutters 110a-110d to drain downward and out of the scrubber system 108. The module vessel 102 is tilted at an angle to promote the flow of the liquid toward the drain path 114.

FIG. 4 further illustrates drainage paths 402 for the liquid from the gutters 110a-110d to the drain path 114. As shown in FIG. 4, collected liquid in the gutter 110a travels along the gutter 110b in a drainage path 402 to a drain hole 404a in the gutter 110b. The collected liquid travels along the drainage path 402 due to the tilt angle of the module vessel 102. Collected liquid in the gutter 110b travels along the gutter 110b in a drainage path 402 to a drain hole 404b in the gutter 110b. Collected liquid in the gutter 110c travels along the gutter 110c in a drainage path 402 to a drain hole 404c in the gutter 110c. Collected liquid in the gutter 110d travels along the gutter 110d in a drainage path 402 to a drain hole 404d in the gutter 110d.

The drain holes 404a-404d allow collected liquid to flow downward in the scrubber system 108 along the drain path 114 between the gutters 110a-110d. For example, collected liquid in the gutter 110a drains through the drain hole 404a and down the drain path 114 to the gutter 110c, where the collected liquid is combined with the collected liquid from the gutter 110b. This combined collected liquid then flows through the drain hole 404b and down the drain path 114 to the gutter 110c, where the collected liquid from the gutters 110a and 110b are combined with collected liquid from the gutter 110c. The collected liquid from the gutters 110a-110c flows through the drain hole 404c and down the drain path 114 to the gutter 110c, where the collected liquid from the gutters 110a-110c is combined with collected liquid from the gutter 110d. The collected liquid from the gutters 110a-110d flows through the rain hole 404d and out of the scrubber system 108.

Accordingly, the volume of collected liquid that flows through the drain holes 404a-404d progressively increases as the collected liquid flows downward from the gutter 110a to the gutter 110d. To accommodate the progressive increase in collected liquid, the sizes of the drain holes 404a-404d may progressively increase as well to achieve a desired flow rate for the collected liquid (which reduced the likelihood of overflow). In particular, the size of the drain hole 404b is greater than the size of the drain hole 404a, the size of the drain hole 404c is greater than the size of the drain hole 404b, and the size of the drain hole 404d is greater than the size of the drain hole 404c. As an example, a ratio of the size of the drain hole 404a to the size of the drain hole 404b may be in a range of approximately 1:2 to approximately 1:3 (e.g., to enable the drain hole 404b to accommodate the collection of liquid from the gutter 110a and the gutter 110b), a ratio of the size of the drain hole 404b to the size of the drain hole 404c may be in a range of approximately 1:2 to approximately 1:3 (e.g., to enable the drain hole 404c to accommodate the collection of liquid from the gutters 110a-110c), a ratio of the size of the drain hole 404c to the size of the drain hole 404d may be in a range of approximately 1:2 to approximately 1:3 (e.g., to enable the drain hole 404d to accommodate the collection of liquid from the gutters 110a-110d), and so on. This enables the drain holes 404a-404d to accommodate the collection of liquid that flows downward through the gutters 110a-110d and the drain path 114. However, other values for the ratios between the gutters 404a-404d are within the scope of the present disclosure.

In some implementations, the drain holes 404a-404d progressively increase in size by approximately 10 millimeters to approximately 20 millimeters to accommodate the collection of liquid that flows downward through the gutters 110a-110d and the drain path 114. As an example, the drain hole 404b may be approximately 10 millimeters to approximately 20 millimeters wider than the drain hole 404a, the drain hole 404c may be approximately 10 millimeters to approximately 20 millimeters wider than the drain hole 404b, and the drain hole 404d may be approximately 10 millimeters to approximately 20 millimeters wider than the drain hole 404c. However, other values for the size increases are within the scope of the present disclosure.

As indicated above, FIG. 4 is provided as an example. Other examples may differ from what is described with regard to FIG. 4.

Figure 5:
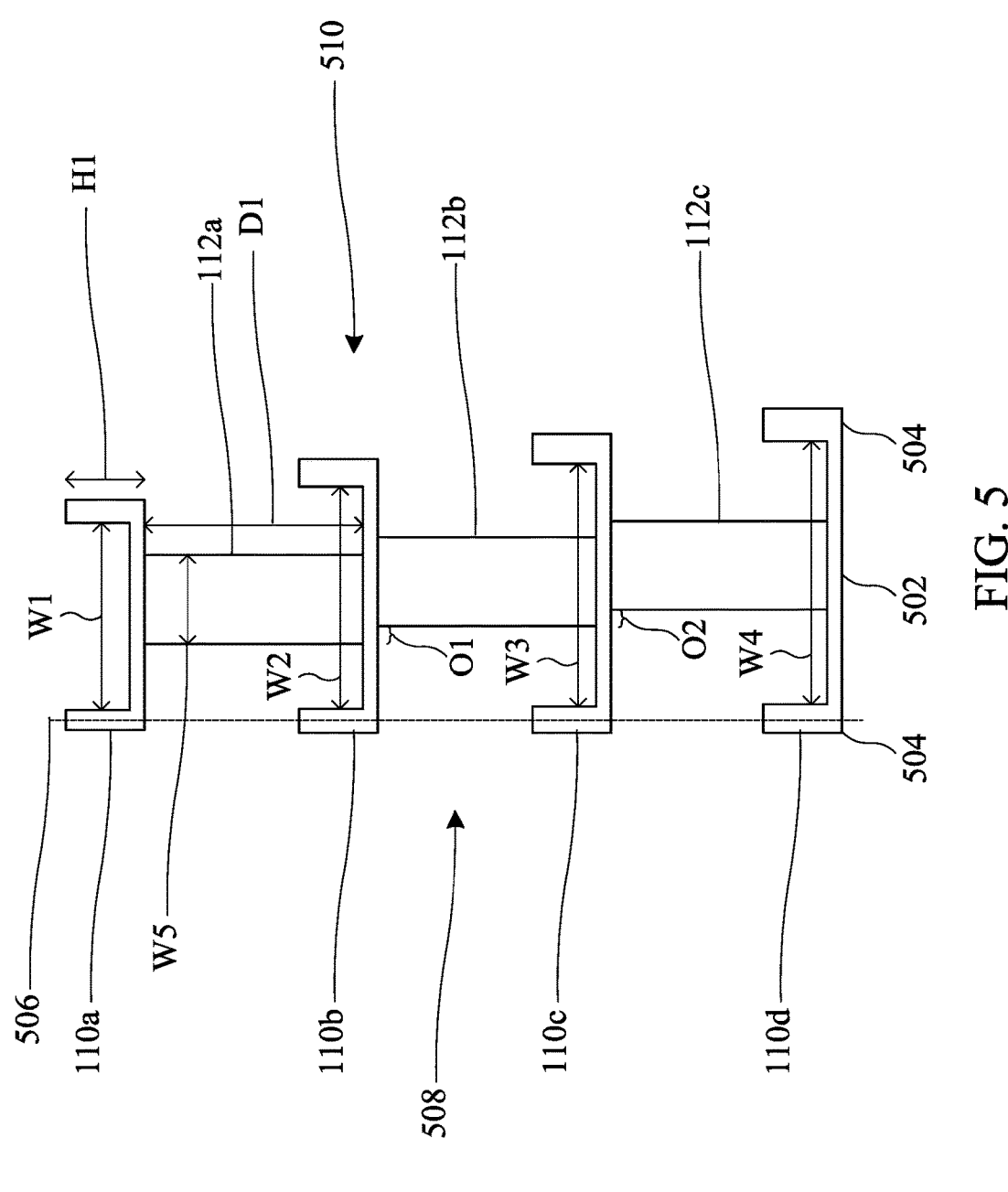
FIG. 5 is a diagram illustrating a cross-sectional view of a scrubber system described herein.

FIG. 5 is a diagram illustrating a cross-sectional view of the scrubber system 108 described herein. The cross-sectional view is taken from the line A-A in FIG. 4. FIG. 5 illustrates various details of the gutters 110a-110d and the vane layers 112a-112c. As shown in FIG. 5, each of the gutters includes a substantially flat section 502 and edges 504 on each side of the ring-shaped structure of the gutters 110a-110d. The height of the edges 504 is greater than the height of the substantially flat section 502 to contain the liquid collected in the gutters 110a-110d.

As shown in FIG. 5, the gutters 110a-110d may be aligned along line 506, which corresponds to the inside edge 508 of the gutters 110a-110d. The inside edge 508 of the gutters 110a-110d is the edge of the gutters 110a-110d that faces inward toward the center of the module vessel 102. As further shown in FIG. 5, the widths of the of the gutters 110a-110d progressively increases from the top (or roof) gutter (e.g., the gutter 110a) to the bottom (or layer 3) gutter (e.g., the gutter 110d). For example, the width W2 of the gutter 110b is greater than the width W1 of the gutter 110a, the width W3 of the gutter 110c is greater than the width W2 of the gutter 110b, and the width W4 of the gutter 110d is greater than the width W3 of the gutter 110c. Examples for the widths W1-W4 include approximately 40 millimeters to approximately 50 millimeters for the width W1, approximately 50 millimeters to approximately 60 millimeters for the width W2, approximately 60 millimeters to approximately 70 millimeters for the width W3, and approximately 70 millimeters to approximately 80 millimeters for the width W4. However, other values for the widths W1-W4 are within the scope of the present disclosure.

As further shown in FIG. 5, because of the progressive increase in the widths W1-W4, the outside edges 510 of the gutters 110a-110d are staggered and progressively extend further outward from the gutter 110a to the gutter 110d. Each of the gutters 110a-110d includes a height H1 (e.g., of the edges 508), which may be the same for the gutters 110a-110d or may be different for one or more of the gutters 110a-110d. In some implementations, the height H1 is in a range of approximately 10 millimeters to approximately 25 millimeters to provide sufficient liquid collection and containment. However, other values for the height H1 are within the scope of the present disclosure.

Moreover, a distance D1 between two of the gutters 110a-110d (e.g., from a top of a flat section 502 of a first gutter to a bottom of a flat section 502 of a second gutter) may be in a range of approximately 80 millimeters to approximately 120 millimeters to allow for sufficient space between gutters for liquid collection. However, other values for the distance D1 are within the scope of the present disclosure. In some implementations, the distance between the gutters 110a-110d (e.g., between adjacent gutters) is the same for the gutters 110a-110d. In some implementations, the distance is different for two or more adjacent sets of the gutters 110a-110d. In some implementations, the distance between two gutters corresponds to the length (or height) of the vane layer between the two gutters. However, other lengths for the vane layers 112a-112c are within the scope of the present disclosure. Moreover, the vane layers 112a-112c may all of the same length, or one or more of the vane layers 112a-112c may have different lengths (e.g., to provide increase surface area for liquid collection). Similarly, the vane layers 112a-112c may all of the same width (W5), or one or more of the vane layers 112a-112c may have different widths (e.g., to provide increase surface area for liquid collection). In some implementations, the lengths and/or widths may increase from the vane layer 112a to the vane layer 112b, and from the vane layer 112b to the vane layer 112c to provide increased surface area for liquid collection.

As further shown in FIG. 5, the vane layers 112a-112b extend between the gutters 110a-110d. In particular, the vane layer 112a extends between the bottom surface of the substantially flat section 502 of the gutter 110a and the top surface of the substantially flat section 502 of the gutter 110b. The vane layer 112b extends between the bottom surface of the substantially flat section 502 of the gutter 110b and the top surface of the substantially flat section 502 of the gutter 110c. The vane layer 112c extends between the bottom surface of the substantially flat section 502 of the gutter 110c and the top surface of the substantially flat section 502 of the gutter 110d.

Due to the progressively increases widths of the gutters 110a-110d, the placement of the fins of the vane layers 112a-112c may be progressively staggered from vane layer 112a to 112c. In particular, the vane layer 112b may be offset from the vane layer 112a by an offset O1, and the vane layer 112c may be offset from the vane layer 112b by an offset O2. In some implementations, the offset O1 and the offset O2 are each in a range of greater than 0 millimeters to approximately 20 millimeters to accommodate the progressively increases widths of the gutters 110a-110d. However, other values for the offset O1 and the offset O2 are within the scope of the present disclosure.

Moreover, the vane layers 112a-112c may be offset relative to the center of one or more of the gutters 110a-112d. As an example, the vane layer 112a may be offset (or off-centered) relative to the center (or midpoint) of the gutter 110a, and may be centered relative to the center (or midpoint of the gutter 110b. As an example, the vane layer 112b may be offset (or off-centered) relative to the center (or midpoint) of the gutter 110b, and may be centered relative to the center (or midpoint of the gutter 110c. As an example, the vane layer 112c may be offset (or off-centered) relative to the center (or midpoint) of the gutter 110c, and may be centered relative to the center (or midpoint of the gutter 110d.

As indicated above, FIG. 5 is provided as an example. Other examples may differ from what is described with regard to FIG. 5.

Figure 6:
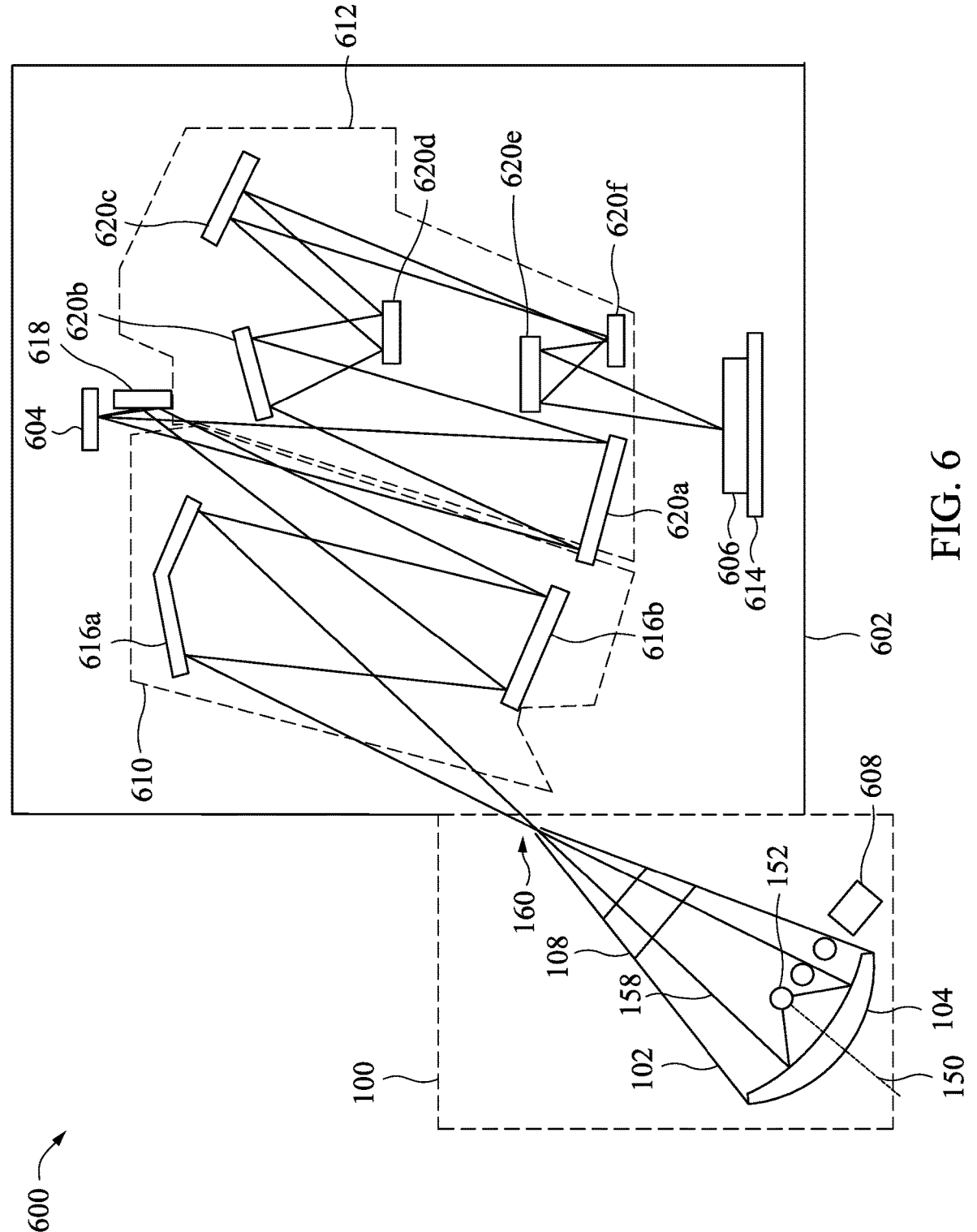
FIG. 6 is a diagram of an embodiment of a lithography system described herein.

FIG. 6 is a diagram of an embodiment of a lithography system 600 described herein. The lithography system 600 includes an EUV lithography system or another type of lithography system that is configured to transfer a pattern to a semiconductor substrate using mirror-based optics. The lithography system 600 may be configured for use in a semiconductor processing environment such as a semiconductor foundry or a semiconductor fabrication facility.

As shown in FIG. 6, the lithography system 600 includes the radiation source 100 and an exposure tool 602. The radiation source 100 (e.g., an EUV radiation source or another type of radiation source) is configured to generate the radiation 158 such as EUV radiation and/or another type of electromagnetic radiation (e.g., light). The exposure tool 602 (e.g., an EUV scanner or another type of exposure tool) is configured to focus the radiation 602 onto a reflective reticle 604 (or a photomask) such that a pattern is transferred from the reticle 604 onto a semiconductor substrate 606 using the radiation 158.

The collector 104 or the radiation source includes a curved mirror that is configured to collect the radiation 158 generated by the radiation source 100 and to focus the radiation 158 toward the intermediate focus 160. The radiation 158 is produced from a plasma (e.g., the plasma 154) that is generated by the target material 152 (e.g., tin (Sn) droplets or another type of droplets) being exposed to a laser beam 150. The target material 152 is provided across the front of the collector 104 by a droplet generator (DG) head 608. The DG head 608 is pressurized to provide a fine and controlled output of the target material 152. The laser beam 150 is provided through an opening such that the plasma is generated in front of the collector 104. The laser beam 150 is pulsed at a timing that is synchronized with the flow of the source material 152 from the DG head 608.

The exposure tool 602 includes an illuminator 610 and a projection optics box (POB) 612. The projection optics box 612 includes a plurality of mirrors that are configured to project the radiation 158 onto the semiconductor substrate 606 after the radiation 158 is modified based on the pattern of the reticle 604. The exposure tool 602 includes a substrate stage 614 (e.g., a wafer stage) configured to support the semiconductor substrate 604. Moreover, the substrate stage 614 is configured to move (or step) the semiconductor substrate 606 through a plurality of exposure fields as the radiation 158 transfers the pattern from the reticle 604 onto the semiconductor substrate 606.

In some implementations, the exposure tool 602 includes a reticle stage (not shown) that configured to support and/or secure the reticle 604. Moreover, the reticle stage is configured to move or slide the reticle through the radiation 158 such that the reticle 604 is scanned by the radiation 158. In this way, a pattern that is larger than the field or beam of the radiation 158 may be transferred to the semiconductor substrate 606.

The illuminator 610 includes a plurality of reflective mirrors that are configured to focus and/or direct the radiation 158 onto the reticle 604 so as to illuminate the pattern on the reticle 604. The illuminator 610 includes a mirror 616a and a mirror 616b. The mirror 616a includes a field facet mirror (FFM) or another type of mirror that includes a plurality of field facets. The mirror 616b includes a pupil facet mirror (PFM) or another type of mirror that also includes a plurality of pupil facets. The facets of the mirrors 616a and 616b are arranged to focus, polarize, and/or otherwise tune the radiation 158 from the radiation source 100 to increase the uniformity of the radiation 158 and/or to increase particular types of radiation components (e.g., transverse electric (TE) polarized radiation, transverse magnetic (TM) polarized radiation).

Another mirror 618 (e.g., a relay mirror) is included to direct radiation 158 from the illuminator 610 onto the reticle 604. The projection optics box 612 includes a plurality of reflective mirrors such as the mirrors 620a-620f. In some implementations, the mirrors 620a-620f are configured to focus or reduce the radiation 158 into an exposure field, which may include one or more die areas on the semiconductor substrate 606.

In an example exposure operation (e.g., an EUV exposure operation), the DG head 608 provides the stream of the target material 152 across the front of the collector 104. The laser beam 150 contacts the source material 152, which causes a plasma 154 to be generated. The plasma 154 emits or produces the radiation 158 (e.g., EUV light). The radiation 158 is collected by the collector 104 and directed out of the radiation source 100 and into the exposure tool 602 toward the mirror 616a of the illuminator 610. The mirror 616a reflects the radiation 158 onto the mirror 616b, which reflects the radiation 158 onto the mirror 618 toward the reticle 604. The radiation 158 is modified by the pattern in the reticle 604. In other words, the radiation 158 reflects off of the reticle 604 based on the pattern of the reticle 604. The reflective reticle 604 directs the radiation 158 toward the mirror 620a in the projection optics box 612, which reflects the radiation 158 onto the mirror 620b. The radiation 158 continues to be reflected and reduced in the projection optics box 612 by the mirrors 620c-620f. The mirror 620e reflects the radiation 158 onto the semiconductor substrate 606 such that the pattern of the reticle 604 is transferred to the semiconductor substrate 606. The above-described exposure operation is an example, and the lithography system 600 may operate according to other EUV techniques and radiation paths that include a greater quantity of mirrors, a lesser quantity of mirrors, and/or a different configuration of mirrors.

As indicated above, FIG. 6 is provided as an example. Other examples may differ from what is described with regard to FIG. 6.

In this way, a scrubber system of a radiation source may include multiple gutters, where lower gutters have a larger unit volume than higher gutters. As described herein, in some implementations, the larger unit volume for the lower gutters prevents overflow induced by a lack of volume of the gutters of the scrubber system. As a result, overflow of the gutters in the scrubber system is prevented, which prevents contamination of or damage to a collector of the radiation source, thereby improving a lifetime of the collector and improving performance of the radiation source.

As described in greater detail above, some implementations described herein provide an EUV source. The EUV source includes a module vessel. The EUV source includes a scrubber system including, a plurality of gutters in the module vessel, the plurality of gutters including a first gutter and a second gutter, where the second gutter is lower than the first gutter in the module vessel, and where a unit volume of the second gutter is larger than a unit volume of the first gutter.

As described in greater detail above, some implementations described herein provide a radiation source. The radiation source includes a module vessel. The radiation source includes a scrubber system including, a first gutter associated with draining a liquid from the module vessel. The radiation source includes a second gutter associated with draining the liquid from the module vessel, where the second gutter is connected to the first gutter to permit the second gutter to receive a portion of the liquid collected in the first gutter, and where a size of the second gutter prevents the second gutter from overflowing due to the portion of the liquid collected in the first gutter being received by the second gutter.

As described in greater detail above, some implementations described herein provide a device. The device includes a module vessel. The device includes a scrubber system including, a plurality of vane layers within the module vessel, the plurality of vane layers including a first vane layer and a second vane layer a plurality of gutters within the module vessel, the plurality of gutters including a first gutter and a second gutter, where the first gutter is to collect liquid via the first vane layer, where the second gutter is to collect liquid via the second vane layer and from the first gutter, and where a unit volume of the second gutter is larger than a unit volume of the first gutter.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A scrubber system, comprising:
a plurality of gutters comprising:
    a first gutter comprising a first drain hole, and
    a second gutter comprising a second drain hole,
        wherein the second gutter is lower than the first gutter in the scrubber system, and
        wherein the second drain hole is larger than the first drain hole.

2. The scrubber system of claim 1, wherein a unit volume of the second gutter is larger than a unit volume of the first gutter.

3. The scrubber system of claim 2, wherein a ratio between the unit volume of the first gutter and the unit volume of the second gutter is in a range of approximately 1:1.7 to approximately 1:2.

4. The scrubber system of claim 1, wherein drain holes of the plurality of gutters progressively increase by approximately 10 millimeters to approximately 20 millimeters in size from a top gutter to a bottom gutter.

5. The scrubber system of claim 1, further comprising a vane between the first gutter and the second gutter.

6. The scrubber system of claim 5, wherein the vane is offset from a center of the first gutter.

7. The scrubber system of claim 6, wherein the vane is offset from the center of the first gutter by a range of greater than 0 millimeters to approximately 20 millimeters.

8. A scrubber system, comprising:
a first gutter associated with draining a liquid and comprising a first drain hole; and
a second gutter associated with draining the liquid and comprising a second drain hole,
    wherein the second gutter is connected to the first gutter to permit the second gutter to receive a portion of the liquid collected in the first gutter,
    wherein a cross-sectional area of the first gutter is smaller than a cross-sectional area of the second gutter, and
    wherein the second drain hole is larger than the first drain hole.

9. The scrubber system of claim 8, wherein a unit volume of the first gutter is smaller than a unit volume of the second gutter.

10. The scrubber system of claim 8, wherein a width of the first gutter is smaller than a width of the second gutter.

11. The scrubber system of claim 8, wherein widths of a plurality of gutters of the scrubber system progressively increase from a top gutter to a bottom gutter, wherein the plurality of gutters includes the first gutter and the second gutter.

12. The scrubber system of claim 8, further comprising:
a third gutter connected to the second gutter; and
a plurality of vanes,
    wherein a first vane, of the plurality of vanes, is between the first gutter and the second gutter, and
    wherein a second vane, of the plurality of vanes, is between the second gutter and the first gutter.

13. The scrubber system of claim 12, wherein the second vane is offset from a center of the second gutter.

14. The scrubber system of claim 13, wherein the first vane is offset from a center of the first gutter.

15. A scrubber system, comprising:
a plurality of gutters comprising a first gutter, a second gutter that is lower than the first gutter, and a third gutter that is lower than the second gutter,
    wherein the first gutter comprises a first drain hole, and the second gutter comprises a second drain hole,
    wherein a cross-sectional area of the second gutter is larger than a cross-sectional area of the first gutter, and
    wherein a cross-sectional area of the third gutter is larger than the cross-sectional area of the second gutter; and
a plurality of vane layers comprising:
a first vane layer between the first gutter and the second gutter, and a second vane layer between the second gutter and the third gutter.

16. The scrubber system of claim 15, wherein a unit volume of the second gutter is larger than a unit volume of the first gutter, and
wherein a unit volume of the third gutter is larger than the unit volume of the second gutter.

17. The scrubber system of claim 15, wherein a unit volume of the second gutter is approximately two times larger than a unit volume of the first gutter.

18. The scrubber system of claim 17, wherein a unit volume of the third gutter is approximately two times larger than a unit volume of the second gutter.

19. The scrubber system of claim 15, wherein sizes of drain holes of the plurality of gutters progressively increase from a top gutter to a bottom gutter.

20. The scrubber system of claim 15, wherein widths of the plurality of gutters progressively increase from a top gutter to a bottom gutter.

\* \* \* \* \*